(12) United States Patent
Trusheim et al.

(10) Patent No.: US 11,586,152 B2
(45) Date of Patent: Feb. 21, 2023

(54) POLARITON-STABILIZED SOLID-STATE SPIN CLOCK

(71) Applicant: Massachusetts Institute of Technology, Cambridge, MA (US)

(72) Inventors: Matthew Edwin Trusheim, Cambridge, MA (US); Kurt Jacobs, Columbia, MD (US); Jonathan Hoffman, Greenbelt, MD (US); Donald Fahey, Washington, DC (US); Dirk Robert Englund, Brookline, MA (US)

(73) Assignees: Massachusetts Institute of Technology, Cambridge, MA (US); The USA as Represented by the Secy. of the Army, Washington, DC (US)

( * ) Notice: Subject to any disclaimer, the term of this patent is extended or adjusted under 35 U.S.C. 154(b) by 0 days.

(21) Appl. No.: 17/504,238

(22) Filed: Oct. 18, 2021

(65) Prior Publication Data
US 2022/0197225 A1   Jun. 23, 2022

Related U.S. Application Data

(60) Provisional application No. 63/127,564, filed on Dec. 18, 2020.

(51) Int. Cl.
*G04F 5/14* (2006.01)
*H03L 7/26* (2006.01)

(52) U.S. Cl.
CPC . *G04F 5/14* (2013.01); *H03L 7/26* (2013.01)

(58) Field of Classification Search
CPC ........................................................ G04F 5/14

USPC ........................................................ 331/94.1
See application file for complete search history.

(56) References Cited

U.S. PATENT DOCUMENTS

| 5,785,426 A * | 7/1998 | Woskov | G01J 5/53 |
| | | | 374/E11.003 |
| 2014/0247094 A1* | 9/2014 | Englund | H03L 7/26 |
| | | | 331/94.1 |

OTHER PUBLICATIONS

Acosta et al. "Temperature dependence of the nitrogen-vacancy magnetic resonance in diamond." Physical Review Letters 104.7 (2010): 070801 (5 pages).
Awschalom et al. "Quantum technologies with optically interfaced solid-state spins." Nature Photonics 12.9 (2018): 516-527 (12 pages).

(Continued)

*Primary Examiner* — Joseph Chang
(74) *Attorney, Agent, or Firm* — Smith Baluch LLP (57) ABSTRACT

An ensemble of spin defect centers or other atom-like quantum systems in a solid-state host can be used as a compact alternative for an atomic clock thanks to an architecture that overcomes magnetic and temperature-induced systematics. A polariton-stabilized solid-state spin clock hybridizes a microwave resonator with a magnetic-field-insensitive spin transition within the ground state of a spin defect center (e.g., a nitrogen vacancy center in diamond). Detailed numerical and analytical modeling of this polariton-stabilized solid-state spin clock indicates a potential fractional frequency instability below $10^{-13}$ over a 1-second measurement time, assuming present-day experimental parameters. This stability is a significant improvement over the state-of-the-art in miniaturized atomic vapor clocks.

20 Claims, 6 Drawing Sheets

(56) References Cited

OTHER PUBLICATIONS

Barry et al. "Sensitivity optimization for NV-diamond magnetometry." Reviews of Modern Physics 92.1 (2020): 015004 (73 pages).
Bennett et al. "Phonon-induced spin-spin interactions in diamond nanostructures: application to spin squeezing." Physical Review Letters 110.15 (2013): 156402 (10 pages).
Bradley et al. "A ten-qubit solid-state spin register with quantum memory up to one minute." Physical Review X 9.3 (2019): 031045 (12 pages).
Breeze et al. "Continuous-wave room-temperature diamond maser." Nature 555.7697 (2018): 493-496 (7 pages).
Candido et al. "Predicted strong coupling of solid-state spins via a single magnon mode." Materials for Quantum Technology 1.1 (2020): 011001 (9 pages).
Chatzidrosos et al. "Miniature cavity-enhanced diamond magnetometer." Physical Review Applied 8.4 (2017): 044019 (6 pages).
Chen et al. "Engineering electron-phonon coupling of quantum defects to a semiconfocal acoustic resonator." Nano Letters 19.10 (2019): 7021-7027 (29 pages).
Chen et al. "Temperature dependent energy level shifts of nitrogen-vacancy centers in diamond." Applied Physics Letters 99.16 (2011): 161903 (5 pages).
Clevenson et al. "Broadband magnetometry and temperature sensing with a light-trapping diamond waveguide." Nature Physics 11.5 (2015): 393-397 (6 pages).
Doherty et al. "The nitrogen-vacancy colour centre in diamond." Physics Reports 528 (2013): 1-45 (101 pages).
Ebel et al. "Dispersive Readout of Room Temperature Spin Qubits." arXiv preprint arXiv:2003.07562 (2020). (5 pages).
Eisenach et al. "Cavity quantum electrodynamic readout of a solid-state spin sensor." arXiv preprint arXiv:2003.01104 (2020) (8 pages).
Hodges et al. "Timekeeping with electron spin states in diamond." Physical Review A 87.3 (2013): 032118 (13 pages).
Jarmola et al. "Temperature-and magnetic-field-dependent longitudinal spin relaxation in nitrogen-vacancy ensembles in diamond." Physical Review Letters 108.19 (2012): 197601 (8 pages).
Kim et al. "A CMOS-integrated quantum sensor based on nitrogen-vacancy centres." Nature Electronics 2.7 (2019): 284-289. (6 pages).
Kraus et al. "Magnetic field and temperature sensing with atomic-scale spin defects in silicon carbide." Scientific Reports 4.1 (2014): 1-8 (8 pages).
Martin et al. "Compact optical atomic clock based on a two-photon transition in rubidium." Physical Review Applied 9.1 (2018): 014019 (10 pages).
Micalizio et al. "Pulsed_optically_pumped rubidium clock with high frequency-stability performance." IEEE Transactions on Ultrasonics, Ferroelectrics, and Frequency Control 59.3 (2012): 457-162 (6 pages).
Neumann et al. "High-precision nanoscale temperature sensing using single defects in diamond." Nano Letters 13.6 (2013): 2738-2742 (6 pages).
Robledo et al. "Spin dynamics in the optical cycle of single nitrogen-vacancy centres in diamond." New Journal of Physics 13.2 (2011): 025013 (12 pages).
Schloss et al. "Simultaneous broadband vector magnetometry using solid-state spins." Physical Review Applied 10.3 (2018): 034044 (13 pages).
Son et al. "Developing silicon carbide for quantum spintronics." Applied Physics Letters 116.19 (2020): 190501 (8 pages).
Stanwix et al. "Coherence of nitrogen-vacancy electronic spin ensembles in diamond." Physical Review B 82.20 (2010): 201201 (5 pages).
Toyli et al. "Fluorescence thermometry enhanced by the quantum coherence of single spins in diamond." Proceedings of the National Academy of Sciences 110.21 (2013): 8417-8421 (5 pages).
Tricot et al. "Power stabilization of a diode laser with an acousto-optic modulator." Review of Scientific Instruments 89.11 (2018): 113112 (7 pages).
Trusheim et al., "A Polariton-Stabilized Spin Clock," arXiv:2009.02427v2 [quant-ph], Sep. 18, 2020, 6 pages.
Vanier "Atomic clocks based on coherent population trapping: a review." Applied Physics B 81.4 (2005): 421-442.
Wolf et al. "Subpicotesla diamond magnetometry." Physical Review X 5.4 (2015): 041001 (10 pages).
Xia et al. "Generating spin squeezing states and Greenberger-Horne-Zeilinger entanglement using a hybrid phonon-spin ensemble in diamond." Physical Review B 94.20 (2016): 205118 (8 pages).
Zhu et al. "Observation of dark states in a superconductor diamond quantum hybrid system." Nature Communications 5.1 (2014): 1-6 (7 pages).

\* cited by examiner

POLARITON-STABILIZED SOLID-STATE SPIN CLOCK

CROSS-REFERENCE TO RELATED APPLICATION(S)

This application claims the priority benefit, under 35 U.S.C. 119(e), of U.S. Application No. 63/127,564, filed on Dec. 18, 2020, which is incorporated herein by reference in its entirety.

GOVERNMENT SUPPORT

This invention was made with Government support under Grant No. W911NF-18-1-0432 awarded by the Army Research Office (ARO). The Government has certain rights in the invention.

BACKGROUND

Timekeeping is ubiquitous in the modern day, with clocks found in nearly all electronic devices and underpinning critical global infrastructure such as telecom networks and global navigation satellite systems. Clocks span the range from inexpensive, relatively imprecise voltage-controlled oscillators, through stabilized quartz oscillators, and finally to atomic frequency standards that set the state-of-the-art in accuracy. A longstanding goal is to bring the performance of atomic systems to the level of electronic circuits, for example, as chip-scale atomic clocks.

Laboratory-scale clocks based on atomic vapors can reach state-of-the-art fractional frequency deviations reaching $10^{-15}$, while scaled-down commercial atomic vapor clocks achieve a fractional frequency stability $\Delta v/v \sim 10^{-10}$ at one second of measurement time in a volume of order 10 cm$^3$, representing orders-of-magnitude improvements in size, mass, and power. Still further reduction may be possible by transitioning to chip-integrated, atom-like solid-state systems operating at room temperature.

To this end, recent work has investigated frequency references based on the diamond nitrogen vacancy center, whose spin-1 electronic ground states ($|m_s=\pm1,0\rangle$) have coherence times at exceeding milliseconds at room temperature, an $m_s=0\rightarrow\pm1$ zero-field splitting near 2.87 GHz, near-unity optical polarization under ambient conditions, and high-fidelity readout by fluorescence or microwave absorption. Moreover, the spin-1 system allows for magnetic-field-insensitive coherence between the $|+\rangle=|-1\rangle+|1\rangle$ and $|0\rangle$ levels, analogous to an atomic clock transition.

The transition in an ensemble of NV centers has been proposed to produce a clock with shot-noise limited fractional frequency stability of $\delta v/v \sim 10^{-12}$ at 1 second—if the clock's temperature could be sufficiently stabilized. Indeed, an NV magnetometer with a sensitivity of about $10^{-12}$ T Hz$^{-1/2}$ could have a shot-noise-limited fractional frequency deviation of $\delta v/v \sim 10^{-11}$ Hz$^{-1/2}$ based on the NV gyromagnetic ratio (28 GHz/T at 3 GHz). Realistically achieving this stability for long integration times, however, would require temperature control at the microkelvin level or technically demanding differential-clock tracking schemes that have yet to be demonstrated. At a realistic thermal instability at the millikelvin level, the absolute fractional frequency precision of an uncompensated NV-diamond clock is near $\delta v/v \sim 10^{-7}$ and thus is not competitive with atomic vapor clocks.

SUMMARY

Here we address this problem of temperature stability in NV-diamond clocks by reducing the oscillator temperature dependence in a hybrid timekeeping device: a polaritonic system comprising of coupled defect center spins and microwave cavity photons that produces an avoided crossing, removing the first-order thermal response and enabling better-than-millihertz stability for realistic spin-photon coupling strengths. Analytical and numerical modeling of the polariton response and spin-cavity input-output relations show that the thermal and magnetic limits to fractional frequency stability can reach below $10^{-13}$ with realistically achievable stabilization. This potential improvement in fractional frequency stability of over five orders of magnitude enables a new class of solid-state, chip-integrated spin-based clocks with applications from positioning, navigation, and timing to instrumentation and telecommunications.

Our polariton-stabilized solid-state spin clock, also called a polariton-stabilized spin clock, uses solid-state quantum defects—"artificial atoms" trapped within a crystal lattice—that are stable in room-temperature environmental conditions and can be chip-integrated. The NV center in diamond is one example of such an artificial atom, where the ground-state spin triplet can be optically polarized in ambient conditions. Unlike spin-½ systems, the spin-spin interaction in NV centers and other spin-1 (or higher) systems allows for a magnetic-insensitive coherence between the $m_s=|X\rangle$ and $|0\rangle$ spin sublevels, in analogy to atomic 'clock' states, which can be long-lived and at GHz frequencies. Magnetometers based on this spin coherence have reached sensitivities of about $10^{-12}$ THz$^{-1/2}$, which, when converted to a fractional frequency deviation at 1 second (2.8 GHz/T at 3 GHz$\Rightarrow\Delta v/v=10^{-12}$, exceeds the performance of traditional quartz oscillators.

Thermal noise, however, limits the achievable fractional frequency deviation of a quantum-stabilized oscillator at long integration times. The spin-spin interactions of the NV centers vary with temperature at a rate of about –80 kHz/K near room temperature. Thermal noise even in stabilized systems can reach millikelvins in amplitude at millisecond timescales. The absolute fractional frequency accuracy of a bare NV-diamond clock is therefore around one part in 10$^7$, even if short timescale performance exceeds that of other devices.

Coupling the spins of the NVs to microwave photons in a polariton-stabilized solid-state spin clock produces spin-microwave polariton eigenstates with a modified thermal and magnetic response that can suppress frequency fluctuations, as described below, resulting in millihertz stability for achievable coupling strengths. This five-order-of-magnitude improvement in thermal stability can enable a new class of solid-state quantum clocks with wide potential application.

An implementation of a polariton-stabilized solid-state spin clock may include a solid-state host inside a microwave resonator or cavity. The solid-state host (e.g., diamond) contains an ensemble of spin defect centers (e.g., NV centers) having a first resonance that decreases in frequency with increasing temperature and increases in frequency with decreasing temperature. Similarly, the microwave resonator has a cavity mode with a second resonance that increases in frequency with increasing temperature and decreases in frequency with increasing temperature. A microwave signal generator in electromagnetic communication with the spin defect centers and the microwave resonator probes a polariton resonance formed by hybridization of the spin defect centers with the cavity mode. This polariton resonance has a center frequency that is stable with temperature. A detector (e.g., a homodyne detector) in electromagnetic communication with the microwave resonator and the spin defect centers detects (in-phase and quadrature components of) reflection and/or transmission of the microwave probe beam as a clock signal having a frequency stabilized with respect to changes in temperature by the polaritons. Such a clock can operate with a fractional frequency deviation of $10^{-13}$ over a measurement time of at least $10^3$ seconds.

A change in the center frequency of the polariton resonance with respect to temperature varies can be based on a detuning of the second resonance with respect to the first resonance. For example, the second resonance can be detuned with respect to the first resonance based on a change in the center frequency of the polariton resonance with respect to temperature.

This clock may include an optical excitation source (e.g., laser), in optical communication with the spin defect centers, to polarize the spin defect centers by illuminating them with an optical pump beam. It may also include a magnetic field source, in electromagnetic communication with the spin defect centers, to detune the first resonance with respect to the second resonance. And it may circuitry (e.g., a PID controller) operably coupled to the microwave signal generator and the detector that locks a frequency of the probe beam to the frequency of the second resonance.

Another example of a polariton-stabilized solid-state spin clock also uses a solid-state host doped with an ensemble of spin defect centers disposed in a microwave resonator having a cavity mode. This clock can be stabilized by probing a polariton resonance formed by hybridization of the spin defect centers with the cavity mode. This polariton resonance has a frequency derivative with respect to temperature $dv_\pm/dT$ that approaches zero at a detuning between the spin defect centers and the cavity mode of $D_\pm=\pm\sqrt{2}g[\sqrt{|R|}]$, where g is a coupling rate between the spin defect centers and the cavity mode and |R| is a magnitude of a ratio of temperature coefficients of the spin defect centers and the cavity mode. At this detuning $D_\pm$, the frequency derivative with respect to temperature $dv_\pm/dT$ can be proportional to $|R|^{3/2}/[g(|R|+1)^2]$. A detector senses reflection and/or transmission of the microwave probe beam as a clock signal having a frequency stabilized with respect to changes in temperature by the polariton resonance.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. Terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 1A and 1B show a polariton-stabilized solid-state spin clock. A microwave probe signal at frequency ω is input to a resonant system, which includes NV centers in diamond with a population relaxation rate γ coupled to a microwave cavity at rate g. The cavity mirrors have effective loss rates $\sqrt{\kappa}$, and the transmitted field is detected as the clock signal. Microscopically, the NV centers act as an ensemble of identical three-level systems in a ladder configuration coupled to a two-level cavity as shown at upper right.

FIG. 2A-2D show transmission spectra of a polariton-stabilized solid-state spin clock under different magnetic and temperature conditions. In the presence of a moderate magnetic field (FIG. 2A), the NV transitions $\omega_i=\pm10$ MHz are split, resulting in three resonant polariton branches as the NV-cavity detuning as swept. At low fields (FIG. 2B), the NV transitions $\omega_i=\pm1$ MHz are nearly degenerate and two polariton branches are visible. Temperature changes shift the resonances of the NV and cavity in opposite directions (FIG. 2C), with a relative magnitude of R=0.3 shown here. The polariton branches have a vanishing derivative with respect to temperature at a detuning D=9.25 MHz, while maintaining a sharp change in phase with microwave probe beam frequency co indicated by the black curve. FIG. 2D shows magnetic-field dependent spectra taken with the cavity detuned to a thermally insensitive operating point. The zero-field spin-cavity detuning D=9.25 MHz, and $\omega_c=2$ MHz for direct comparison with FIG. 2C (solid curve). At zero field there is a vanishing change in polariton frequency with magnetic field. FIGS. 2A-2D use κ=500 kHz, γ=3 MHz, and g=5 MHz. White corresponds to zero transmission.

FIG. 3A shows the thermal response of the polariton resonance frequency assuming R=1. The traces correspond to an increase in coupling strength from g=0 to g=5 MHz. Zero relative frequency corresponds to the NV zero-field splitting. FIG. 3B shows the polariton resonance frequencies as a function of temperature about the zero-response operating point. Lines indicate changes in coupling from g=0.5 MHz to from g=5 MHz. FIG. 3C shows the polariton resonance frequencies as a function of temperature about the zero-response operating point, with R varying from 0.1 to 1. FIG. 3D shows the polariton frequency error resulting from thermal and magnetic instabilities. Dashed lines represent temperature instability descending logarithmically from 100 mK to 1 mK. Solid lines represent magnetic field instability descending logarithmically from 100 nT to 1 nT.

DETAILED DESCRIPTION

A polariton-stabilized solid-state spin clock uses controlled coupling to suppress the thermal shifts of both the cavity and spin system, resulting in a stability improvement of five orders of magnitude for achievable thermal noise conditions while maintaining magnetic in-sensitivity. Combined with the large SNR of bulk NV sensors, this results in fractional frequency deviations that exceed current chip-scale atomic clocks and mechanical oscillators. A polariton-stabilized solid-state spin clock does not need precision optical elements. It can operate at ambient temperature and pressure and offers significant advantages in size, weight, and power over other clocks with similar performance. With CMOS integration and miniaturization of diamond, a polariton-stabilized solid-state spin clock enables a range of new applications using atomic-like timekeeping in a solid-state device.

Polaritonic stabilization is extensible to a variety of solid-state systems. Emitters in silicon carbide have also shown room-temperature optical spin polarization, potentially with lower intrinsic thermal dependence than NV centers and could extend production of polariton-stabilized solid-state spin clocks to the wafer scale. Other types of bosonic modes, such as mechanical resonators, could take the place of the microwave cavity as similar spin-boson coupling rates have been observed in spin-mechanical systems. Finally, exotic materials, such as coherent magnons, could enable the construction of similar coupled systems with engineered thermal and magnetic response.

Polariton-Stabilized Solid-State Spin Clock Architecture

Figure 1A:
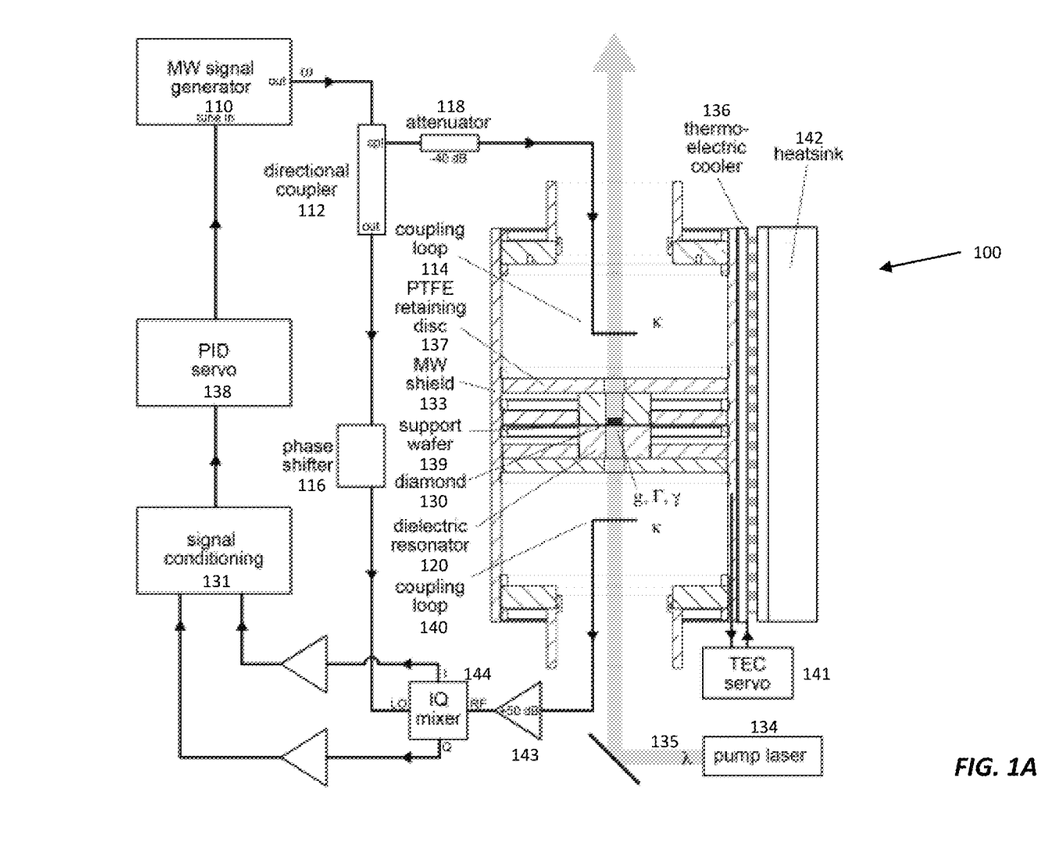
Figure 1B:
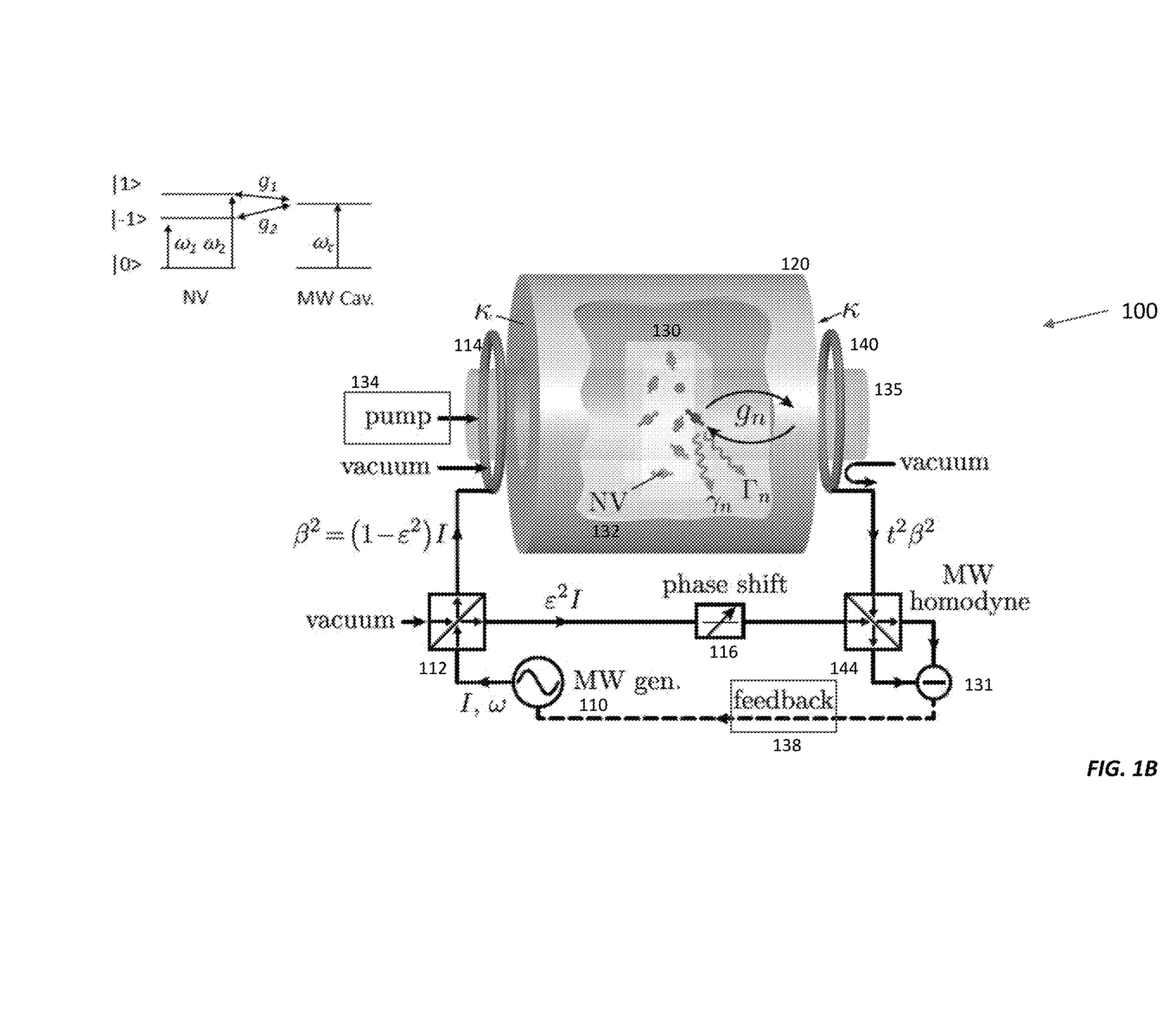

FIGS. 1A and 1B illustrate a polariton-stabilized solid-state spin clock 100. The clock 100 includes a resonator or cavity 120 that contains a solid-state host doped with spin defect centers (not shown) in planar diamond 130, which can be mounted on a SiC support wafer 139 inside the resonator 120. A pump laser 134 illuminates the diamond 130 with a pump beam 135 through a hole in the resonator 120, e.g., with continuous-wave green (532 nm) light, to optically polarize the NV centers. The resonator 120 may be a solid dielectric resonator, hollow metallic resonator, or another style of microwave resonator with sufficiently large quality-factor and optical access for the pump laser 134. PTFE or low-microwave-absorbing retaining discs 137 can be used to secure the dielectric resonator 120 in a metallic microwave shield 133.

Three orthogonally oriented Helmholtz coils (e.g., of 30-50 loops each) or another magnetic field source (not shown) apply a control or bias magnetic field to the spin defect centers 132. This control magnetic field tunes the resonance frequency of the ensemble of NV centers 132 with respect to the resonance frequency of the cavity 120. (Alternatively, or in addition, the resonance frequency of the cavity 120 can be tuned by heating the cavity 120 with a heater or straining the cavity 120 with a piezoelectric actuator.) As explained below, these resonance frequencies may be detuned slightly for temperature-insensitive performance. Alternatively, the NV centers may be operated at zero magnetic field and the resonator may be tuned to obtain temperature-insensitive performance.

The resonator 120 and diamond 130 can be mounted inside the metallic microwave shield 133 to preserve the quality factor and recycle microwaves within the resonator 120. This shield 133 supports the desired microwave mode of the cavity 130 by creating a well-defined boundary condition that prevents radiation into the far field. The shield 133 can be wrapped in copper tubing coated with heat sink paste. Running chilled or heated water through the copper tubing controls the temperature of the resonator 120 and dissipates heat. The resonator 120 and diamond 130 can also be controlled using other active devices, such as a thermoelectric cooler (TEC) 136 actively controlled with a TEC servo 141, and/or with passive measures, such as heat-sink fins 142.

The clock 100 also includes a microwave subsystem that couples microwave photons to the spins of the NV centers via an alternating-current (AC) magnetic field. As shown in FIG. 1A, the microwave subsystem includes a microwave signal generator 110 (e.g., a disciplined voltage-controlled oscillator (VCO)), directional coupler 112, attenuator 118, phase shifter 116, input coil 114, output coil 140, signal amplifier 143, and in-phase/quadrature (IQ) mixer 144. The input coil 114 and output coil 140 are positioned on opposite sides of the diamond 130 just inside or outside the resonator 120. In operation, the microwave signal generator 110 drives the input coil 114 via the directional coupler 112, causing the input coil 114 to probe the NV centers with a microwave probe field. The output coil 140 converts the field transmitted by the coupled NV/resonator system into an output or transmitted microwave signal.

The microwave photons in the microwave probe field interact with the NV centers to form temperature-insensitive polaritons. The microwave photons and NV systems should not be treated independently due to the strong coupling between them, and the combined hybrid resonance (the polariton mode) has a center frequency that is stable with temperature. The temperature insensitivity of the polaritons stems from the oppositely directed temperature dependence of the resonance frequencies of the resonator 120 and of the NV centers: increasing temperature causes the resonance frequency of the resonator 120 to increase and causes the resonance frequency of the NV centers to decrease; decreasing temperature causes the resonance frequency of the resonator 120 to decrease and causes the resonance frequency of the NV centers to increase. In other words, the NV centers have a negative temperature coefficient and the cavity 120 has a positive temperature coefficient. As a result, the polariton coupling between the microwave photons and the NV centers has a resonance frequency that is relatively stable with temperature.

In principle, the temperature dependence of the hybrid polariton mode between the microwave photons and the NV centers can be nulled completely so that temperature no longer is the leading systematic. Instead, intensity fluctuations in the pump laser beam 135, vibrations, or magnetic noise begin to dominate. Quantitatively, the resonance frequency of the hybrid polariton mode has a temperature stability that is orders of magnitude better than the bare cavity 130 or NV centers alone. More precisely, has a temperature sensitivity that is strongly suppressed relative to the non-coupled case over a range of about 10 K and that goes to zero at one temperature in that range.

At the same time, the directional coupler 112 directs a portion of the microwave probe beam to the phase shifter 116 as a local oscillator or reference beam. The phase shifter 116 shifts the phase of the reference beam before coupling it to the IQ mixer 144. IQ mixer 144 combines the reference signal with the probe signal and converts it to baseband in-phase and quadrature components. These components are detected by a digitizer and signal conditioning device 131 which operates on the I and Q components to produce a phase shift signal. A standard double-balanced mixer can also be used, in which case the phase shifter 116 is essential to accessing the phase quadrature of the mixed signal. (The clock 100 can also use a reflection geometry in which a circulator couples the microwave signal from the directional coupler 112 to the input coil 114 and couples the reflected response from input coil to the IQ mixer 144.)

The homodyne signal measured by the IQ mixer 144 represents the output of the clock 100. Taking the arctangent of the in-phase and quadrature components of the homodyne signal measured by the IQ mixer 144 yields the phase of the homodyne signal. This phase changes with changes in the resonance frequency of the resonator 120. A zero-crossing in the phase response occurs when the microwave probe beam is resonant with the resonator 120. If desired, the output of the microwave signal generator 110 can be locked to the cavity 120 using a servo 138 and feedback loop as shown in FIG. 1A. This feedback loop can use a double-balanced mixer instead of the IQ mixer 144 or Pound-Drever-Hall locking with a 10 MHz phase modulation signal for additional immunity to noise and better filtering.

The process of probing the resonance of the cavity 120 with the microwave probe beam from the microwave signal generator 110 can be described with the following formalism. Each NV has two magnetic resonance transitions corresponding to its $|m_s=0\rangle$ to $|m_s=\pm\rangle$) transitions within the NV ground state spin triplet, with spin-cavity coupling rates $g_{n,35}$ and dephasing rates $\Gamma_{n,35}$. The cavity 120 has a resonance at frequency $\omega$ and a loss rate $\kappa$ and is probed continuously by the microwave probe beam at a frequency $\omega$. The NV centers are continuously optically polarized, which is modeled here as damping at a rate of $\gamma_{n,\pm}$ that keeps the ensemble of NV centers close to the $|0\rangle$ state. For a weak, continuous microwave probe beam with a field amplitude $\beta$, the transmitted microwave beam has a field amplitude $t\beta$, where:

$$t = \frac{\kappa}{\kappa + \kappa_l + i\Delta + C}. \quad (1)$$

In Eqn. (1), $\kappa_l$ is the internal cavity loss rate, $\Delta=\omega_c-\omega$, C sums over all the spin transitions of all of the NV centers:

$$C = \sum_{n,j} \frac{g_{n,j}^2}{(\Gamma_{n,j} + \gamma_{n,j})/2 + i\Delta_{n,j}}, \quad (2)$$

where $\Delta_{n,j} = \omega_{n,j} - \omega$.

Homodyne detection is implemented by splitting the output of the microwave signal generator 110 with power I with the directional coupler 112 into two beams—the microwave probe beam and the reference beam—and then mixing the reference beam with the cavity output using the IQ mixer 144 as depicted in FIGS. 1A and 1B. This scheme allows for measurement of any quadrature of the cavity output field using the IQ mixer 144 depending on the phase shift applied to the reference beam by the phase shifter 116 and appropriate mathematical manipulation of the detected I and Q components.

Cavity Transmission Phase Response

Figure 2A:
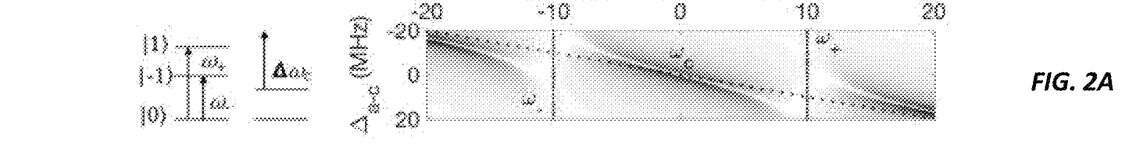

FIGS. 2A-2D are plots of the optimally sensitive phase quadrature Im [t] detected with the IQ mixer 144 for the coupled spin-cavity system under the realistic parameters summarized in TABLE 1 (below). We assume equal dephasing rates for each spin sub-level $\Gamma_{n\pm}=\Gamma$, equal optical polarization rates $\gamma_{n,35}\pm\gamma$, and equal coupling $g_{n,\pm}=g_0$, achieved via a properly polarized cavity mode along the crystalline [100] direction of the diamond 130. FIG. 2A assumes an external magnetic field oriented along the [100] crystalline axis, producing a Zeeman splitting of $\Delta_\pm=10$ MHz between the $m_s=\pm 1$ states. The transmission shows a clear normal-mode splitting as the cavity matches the spin resonance frequencies $\omega_+$ and $\omega_-$. These are the energies of the spin-cavity polariton modes, which were experimentally observed recently for an NV ensemble coupled to a dielectric micro-resonator cavity.

TABLE I

Sample parameters for the polaritonic clock.

| Parameter | Symbol | Current | Outlook |
|---|---|---|---|
| Cavity output rate (kHz) | $\kappa$ | $2\pi \cdot 200$ | $2\pi \cdot 50$ |
| NV dephasing rate (MHz) | $\Gamma$ | $2\pi \cdot 3$ | $2\pi \cdot 1$ |
| Cavity-NV coupling (MHz) | g | $2\pi \cdot 1$ | $2\pi \cdot 5$ |
| Temperature sensitivity ratio | R | −0.1 | −0.05 |
| Single cavity-NV coupling (Hz) | $g_0$ | 0.1 | 0.3 |
| Number of NV centers | N | $2.5 \cdot 10^{14}$ | $4 \cdot 10^{14}$ |
| Input MW power (photons/sec) | I | $1 \cdot 10^{18}$ | $1 \cdot 10^{20}$ |
| Temperature Stability (mK) | $\Delta T$ | 10 | 1 |

Figure 2B:
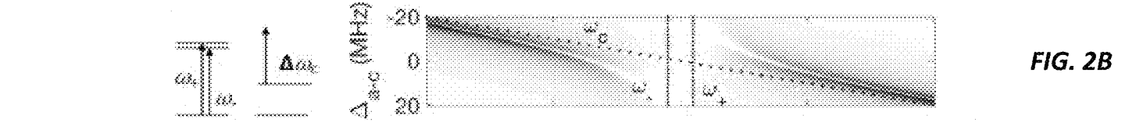

The solid white contours in FIG. 2A closely follow the eigenfrequencies of the cavity-spin polariton energies $\lambda_j$ in the limit of low atomic damping. The corresponding eigenstates are the dressed states of a three-level spin system coupled by a classical driving field, which shows characteristic avoided crossings as the bare spin and cavity are nearly resonant. These avoided crossings merge into one as the magnetic field vanishes as shown in FIG. 2B. If the frequency of the microwave probe beam deviates from the polariton resonance, the non-zero output phase is used as a feedback signal to correct the oscillator and provide long-term stability. The modified cavity transmission spectrum due to atom-cavity hybridization will allow cancellation of the primary source of temperature dependence of the polariton frequency to first order.

Figure 2C:
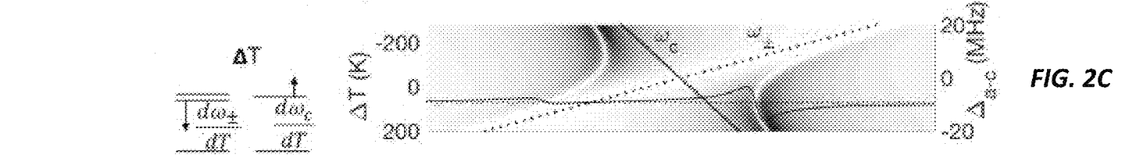

FIG. 2C depicts Im[t] for a room-temperature detuning $\Delta T$ of the polariton-stabilized solid-state spin clock between −200 to 200 K for a typical ceramic microwave resonator characterized by R≈0.3. The thermal response of the NV centers 132 and cavity 120 are modeled at room-temperature as linear with coefficients $d\omega/dT=77$ kHz/K and $d\omega_c/dT=Rd\omega_a/dT$, where R defines their ratio. The ratio R can be change by engineering the material and/or electro-magnetic mode of the resonator 120.

The transmission in FIG. 2C shows a temperature-insensitive operating point at an atomic-cavity detuning $\Delta_{a-c}=9.1$ MHz where the change in polariton frequency with temperature vanishes. By locking the frequency $\omega$ of the microwave probe beam to this operating point, it is thus possible to cancel the temperature dependence to first order. This operating point retains the magnetic-field insensitivity of the $|+\rangle=|-1\rangle+|1\rangle$ and $|0\rangle$) transition.

Figure 2D:
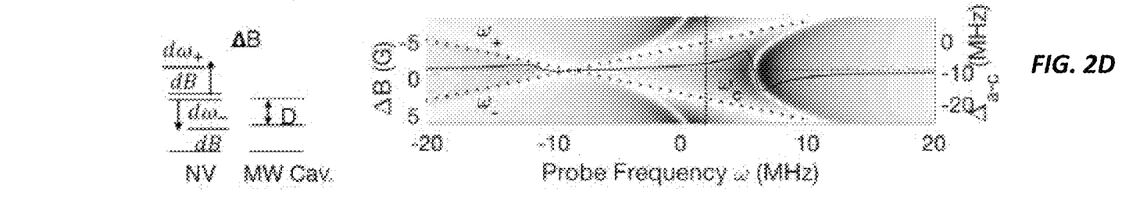

FIG. 2D depicts Im[t] as a function of an environmental or ambient magnetic field that cannot be compensated and shows a vanishing change at an operating point of 0 G. This first-order frequency stability against temperature and magnetic field shifts underpins operation the polariton-stabilized solid-state spin clock.

Performance of a Polariton-Stabilized Solid-State Spin Clock

A figure of merit for a polarization-stabilized solid-state spin clock is the change of polariton frequency with temperature, $dv/dT$. We calculate this value from the analytical model of the cavity-spin system, which in the limit of small spin Zeeman shift ($\omega_1 = \omega_2$), gives a simplified solution for the polariton energies $$v_\pm = \frac{\omega_c + \omega_a}{2} \pm \sqrt{(\omega_c + \omega_a)^2/4 + (g_+^2 + g_-^2)}. \quad (3)$$

Assuming equal coupling coefficients $g_+ = g_- = g$, the polariton thermal dependence is $$2\frac{dv_\pm}{dT} = \frac{d\omega_a}{dT} + \frac{d\omega_c}{dT} \pm \frac{\left(\frac{d\omega_a}{dT} - \frac{d\omega_c}{dT}\right)(\omega_c - \omega_a)}{\sqrt{(\omega_c - \omega_a)^2 + 8g^2}}. \quad (4)$$

Figure 3A:
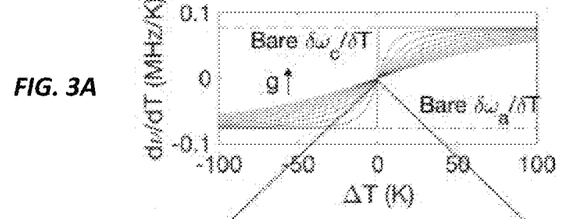
FIGS. 3A-3D illustrate thermal stability of a polariton-stabilized solid-state spin clock.

This yields a large reduction in $dv_\pm/dT$ in the regime where the coupling is greater than the thermal shift, as shown in FIG. 3A. For large temperature shifts, the polariton thermal dependence approaches that of the uncoupled spin or cavity system. The thermal dependence $dv/dT$ approaches zero, however, at a particular spin-cavity detuning $\Delta_{a-c} = D_\pm$ as long as the thermal coefficients of the NV centers and cavity are opposite in sign, R<0:

$$D_\pm = \pm\sqrt{2}\, g\left(\sqrt{|R|} - \frac{1}{\sqrt{|R|}}\right). \quad (5)$$

Near this operating point, the polariton resonance frequency $v_\pm$ has only second-order dependence on temperature, resulting in a linear $dv_\pm/dT|_D \propto |R|^{3/2}/[g(|R|+1)^2]$.

Figure 3B:
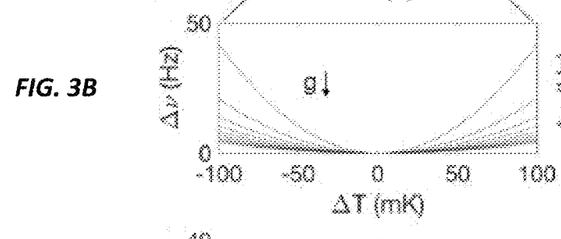
Figure 3C:
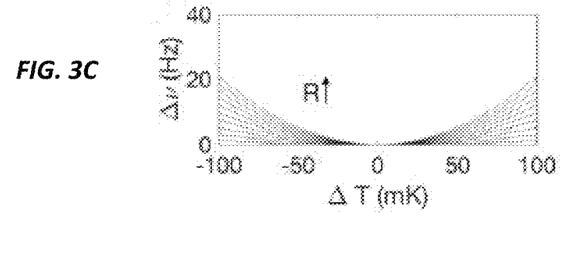

FIGS. 3B and 3C show the change in polariton frequency for a given temperature shift relative to the operating point, $\Delta v$, for various assumptions of the relative thermal responses R and coupling rates g. In FIG. 3B, the ratio R=1 and the coupling rate g is swept from 0 MHz to 5 MHz. (The coupling rate g can be changed by changing the laser excitation power or by using different NV densities, diamond sizes, or resonator geometries.) A temperature-insensitive operating point can be seen as $dv/dT=0$ $D_+ \Rightarrow \omega_c = \omega_a$, for all values of the coupling rate g with the described quadratic energy dependence (linear derivative). FIG. 3C shows the thermal response about the operating point $D_+$ for varying R with a fixed coupling rate g=1 MHz.

Figure 3D:
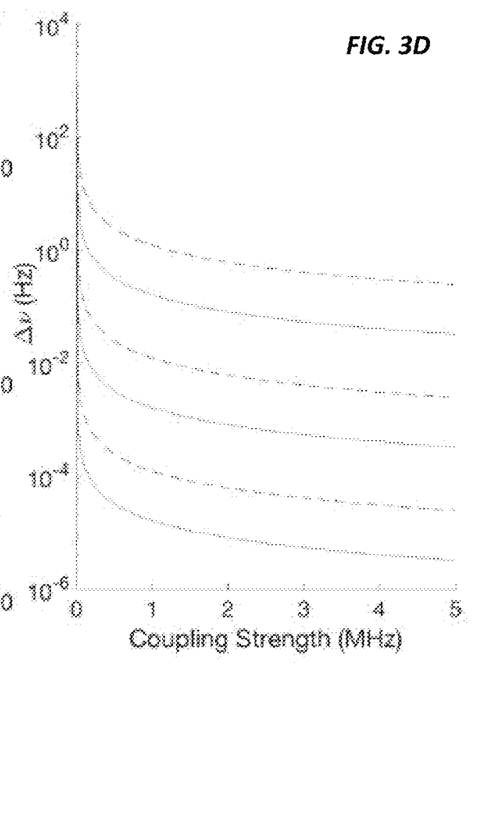

Finally, FIG. 3D shows the limits of frequency accuracy as a function of coupling g for different thermal and magnetic instabilities. A limit in the range of millihertz is possible for magnetic instability on the order of nanotesla and thermal instability on the order of millikelvin.

A figure of merit for clocks is the achievable fractional frequency deviation, ($\delta v/v$. The fractional frequency deviation is affected by the oscillator stability and the measurement signal-to-noise ratio (SNR) of the homodyne signal achievable over a given measurement time. The signal measured in the polariton-stabilized solid-state spin clock is the transmitted microwave field quadrature detected via homodyne readout, the noise for which is set by fundamental quantum processes. We perform a full noise analysis of the homodyne detection using input-output theory. In the limit of low excitation and far detuned NVs, the precision of a frequency measurement achieved after an integration time i is approximately $$\delta v = \left(\frac{\kappa}{\sqrt{\tau I}}\right)\sqrt{1 + \xi^2/2} \quad (6)$$

in which I is the power of the microwave signal generator in microwave photons per second, $\kappa$ is the cavity linewidth, and $\zeta = \kappa_i/\kappa$ is the ratio of the cavity's internal loss rate to the cavity's output rate. Finite detuning of the NVs, $\Delta \lesssim \Gamma$, increases the error by a factor of order unity. Improved performance is achieved by increasing the probe power and decreasing the cavity loss rate, but these parameters are limited by the assumption of low excitation of the NV centers given by $$\beta \ll \frac{\sqrt{\kappa \gamma_{n,j}(\gamma_{n,j} + \Gamma_{n,j})}}{4g_{n,j}|t|}, \forall n, j, \quad (7)$$

in which |t| is of order unity. This limit is reached at around $\beta^2 \approx 10^{20}$ photons/sec for experimental parameters. Given the resulting measurement SNR, the polariton resonance can be determined to a fractional precision $\delta v/v$ after a measurement time $\kappa/\omega_a \cdot \text{SNR}(\tau) < 10^{-13}$ T Hz$^{-1/2}$.

Figure 4:
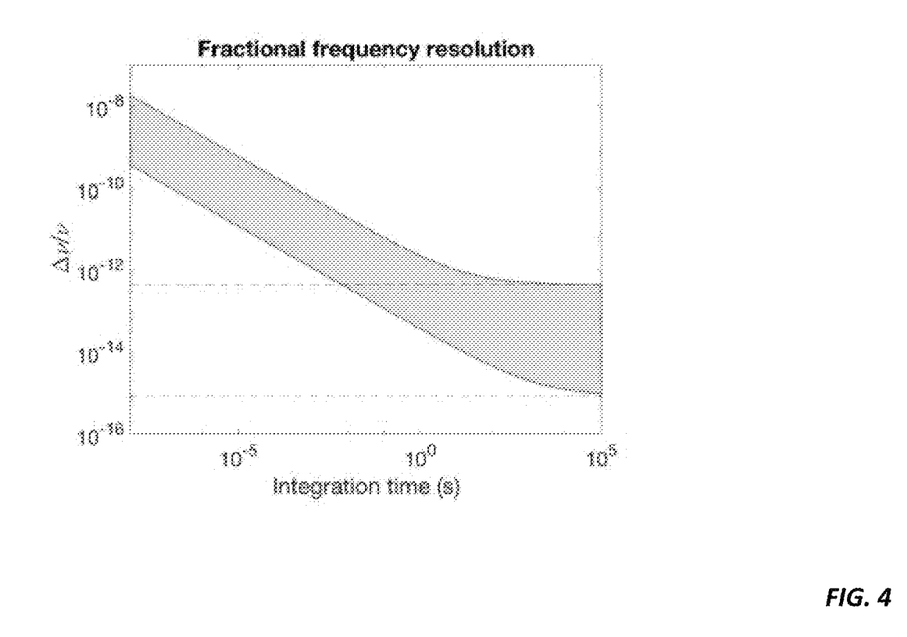
FIG. 4 shows the fractional frequency resolution of a polariton-stabilized solid-state spin clock. The top bound is given by the current parameter set in TABLE 1, and the lower bound by the outlook parameters. Dashed lines indicate the thermal-stability floors.

FIG. 4 shows the minimum frequency deviation of a polariton-stabilized solid-state spin clock given several realistic levels of environmental instability as a function of spin-cavity coupling. Combining these processes, FIG. 4 plots the predicted fractional frequency deviation as a function of time, indicating that with an achievable temperature stability of 1 mK, the polaritonic clock reaches the thermal stability limit below the $10^{-14}$ level after a few hundred seconds of averaging. Environmental fluctuations may limit the minimum achievable frequency deviation of the polariton-stabilized solid-state spin clock at long integration times.

The optical spin polarization produced under off-resonant laser pumping has at least two implications for clock performance. First, it leads to a tradeoff between the power of the optical pump beam used to initialize the NV centers and the SNR of the homodyne signal. Using a simple rate equation model, the steady-state spin polarization (defined as the fraction of total population in the $|0\rangle$ state) is given by $P = (\gamma + g_0\alpha)/(\gamma + 2g\alpha + \gamma_0)$ where $\gamma_0 = 1/T_1$ is the spin relaxation rate in the absence of the cavity microwave drive (Rabi frequency $g\alpha$) and optical polarization (rate $\gamma$). Following Eqn. (7), setting low spin excitation P~0 results in a tradeoff between the intracavity microwave field amplitude and optical polarization rate $\gamma$. This in turn results in a tradeoff between power consumption (dominated by the laser pump) and measurement SNR. Current NV sensors use laser powers on the order of watts to achieve $\beta^2 \sim 10^{20}$ photons/sec. An increase in the single spin-cavity coupling $g_j$, for example via a reduced cavity mode volume, would allow for improved measurement SNR with fixed power budget.

Second, fluctuations in laser power can change the net spin polarization, resulting in a change in coupling g and thus polariton frequency. In steady-state, the change in spin polarization with optical polarization rate is $dP/d\gamma = \gamma_0/(\gamma + g\alpha + \gamma_0)^2$. NV ensembles have lifetimes in the 10-millisecond range under ambient conditions, compared to the microsecond optical pumping rates that can be achieved without line broadening, resulting in a fractional change in coupling with optical power fluctuations $dg/g \sim 10^{-8} d\gamma/\gamma$. To reach thermal limits, a polariton-stabilized solid-state spin clock should have a fractional stability on the order of 1 ppm, which can be achieved via active feedback.

Several additional elements can influence clock stability. Magnetic fields can cause a resonance shift, although they are suppressed to first order due to the spin-1 nature of the NVs. The frequency shift for a given magnetic field is shown in FIG. 2D, showing this first-order cancellation, and as a function of coupling strength in FIG. 3D. To reach the thermal limits described above, magnetic fluctuations should be reduced below 10 nT. This can be accomplished with passive shielding as in other compact atomic clocks. The diamond and cavity should be in thermal equilibrium for the polaritonic compensation to function, which requires slow thermal shifts (that is, slow compared to the thermal constants of the diamond and cavity, e.g., minutes). Thermal isolation between the diamond and cavity with low thermal conductivity materials produces slow thermal shifts. Aging of the microwave cavity could also result in a change in spin-cavity detuning and a polariton shift from the desired operating point. This could be detected by probing both polariton branches $v_\pm$ and tracking their relative frequency, followed by a re-calibration if appropriate.

Changes in strain, including vibrations, can affect clock performance, although the high frequency of the clock (far above mechanical resonances) and high Young's modulus of diamond suppresses these effects. Higher-order dependencies of the NV and microwave cavity with temperature could play a role as the first-order effects are reduced or eliminated, and non-Gaussian ensemble inhomogeneity could result in a complex, potentially time varying resonance line shape. These effects may bound the achievable long-term accuracy of a polariton-stabilized solid-state spin clock.

The achievable shot-noise-limited SNR given above is bounded by the assumption of low excitation of the spin population. Beyond this regime, however, pulsed operation of a polariton-stabilized solid-state spin clock becomes possible as coherent manipulation faster than dephasing or cavity loss is achievable. The use of dynamical decoupling sequences could allow for a reduction in NV linewidths towards the kHz regime, comparable to cesium clocks. Further schemes based on two probe fields, e.g., a coherent population trapping clock may be possible in this limit, as well as schemes involving collective non-classical behavior, such as ensemble squeezing. The continued improvement in coupling strengths or decrease in cavity loss rates should yield a net improvement in performance but may use a control scheme more advanced than the continuous-wave approach described with respect to FIGS. 1A and 1B.

Simulated and Experimental Clock Measurements

Nulling of the cavity/NV-spin polariton temperature coefficient was verified using an experimental setup similar to the one depicted in FIGS. 1A and 1B. The reflected microwave field from the cavity was measured instead of the transmitted field. This was accomplished through use of a microwave circulator positioned after the signal arm attenuator and before the input coupling loop. The microwave signal generator was a Stanford Research Systems SG396 vector signal generator operated at a level of 12 dBm. The output frequency of the probe beam generated by the microwave signal generator was swept by a computer-controlled signal. The coupled output sent to the cavity was attenuated down to approximately −50 dBm after component losses and fixed attenuators.

The reflected, phase-shifted field from the cavity was amplified by 55 dB with a low-noise-figure amplifier made by RF-Lambda before being mixed with the local oscillator in an IQ mixer made by Marki Microwave. The baseband I and Q outputs of the mixer were each amplified via Stanford Research Systems SR560 low-noise preamplifiers before being separately digitized by a National Instruments USB 6363 16-bit DAQ at an acquisition rate of 500 kSamp/s. The coupling loop was fabricated by stripping the end of a low-loss microwave coaxial cable (Mini-circuits), forming a loop with the signal wire, and shorting the loop to the cable shield. The Helmholtz coils included 30-50 loops of coated copper wire driven by programmable current supplies (KEPCO).

Alignment of the field and calibration of the NV center spin Zeeman shift was accomplished through optically detected magnetic resonance spectroscopy. The diamond was a commercially available (element6) bulk irradiated and annealed sample with NV concentration >3 ppm, and approximate dimensions of 3 mm×3 mm×1 mm. It was mounted on a 300-micrometer thick, two-inch diameter wafer of high-purity, semi-insulating silicon carbide. The dielectric resonator had a dielectric constant of 34, loss tangent of roughly 0.001, and a center bore with a 4 mm diameter for optical access. The temperature of the system was controlled via chilled water (Solid State Systems T-Cube) pumped through hollow copper tubing tightly wrapped around the microwave shield and monitored with a Thorlabs TSP01 temperature and humidity sensor. Pump light was provided by a Lighthouse Photonics Sprout 10 W 532 nm laser attenuated to send roughly 3 W of optical power uniformly across the diamond. Temperature coefficient data was obtained by changing the chiller temperature to seven different temperatures, with a wait time of one hour between changes, and then sweeping the microwave field across the cavity for a range of NV center spin detunings to map out the polariton-induced cavity frequency shift.

Figure 5A:
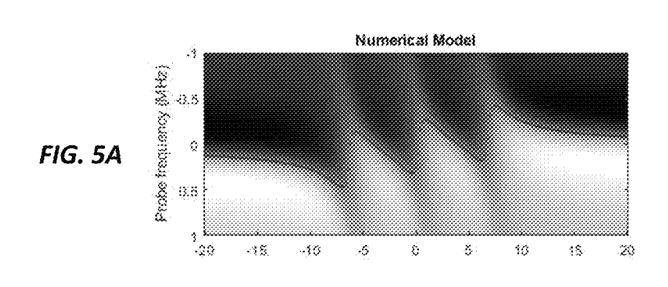
FIG. 5A is a plot of the numerically modeled the phase of the microwave radiation reflected by the cavity versus the NV Zeeman shift.
Figure 5B:
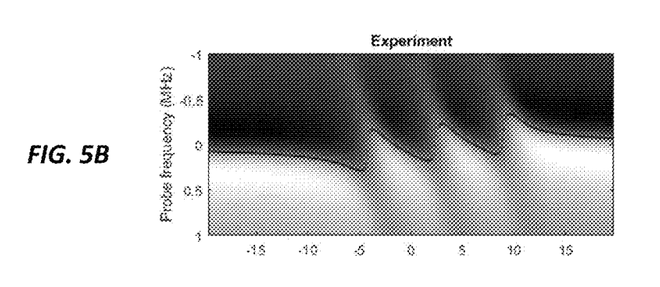
FIG. 5B is a plot of the experimentally measured phase of the microwave radiation reflected by the cavity versus NV Zeeman splitting frequency.

FIGS. 5A and 5B show modeled and measured cavity reflectivity spectra, respectively. FIG. 5A depicts numerical modelling of reflected microwave phase showing the anti-crossing as the NV frequency is swept across the cavity resonance. The three peaks are due to the $^{14}N$ hyperfine levels of the NV ensemble. FIG. 5B depicts the experimentally reflected microwave phase showing the anti-crossing as the NV frequency is swept across the cavity resonance. In both plots, a clear anti-crossing is observed, indicating formation of an NV-cavity polariton.

Figure 6A:
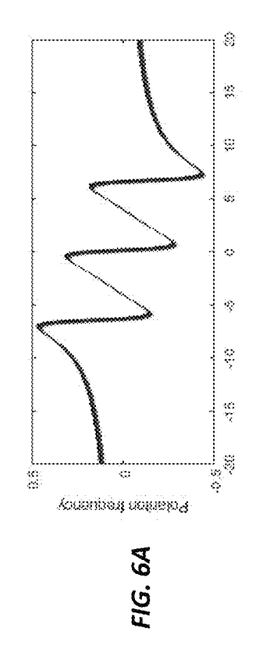
FIG. 6A is a plot of the numerically modeled polariton frequency versus NV Zeeman splitting frequency, where different traces represent different temperatures.
Figure 6B:
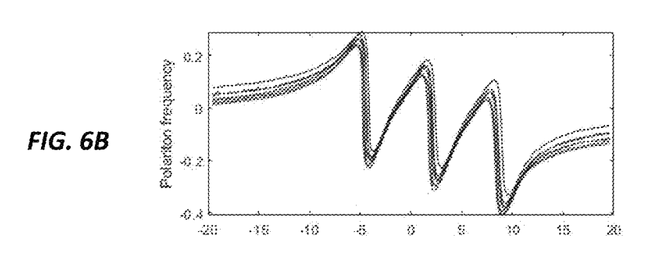
FIG. 6B is a plot of the experimentally measured polariton frequency versus NV Zeeman splitting frequency, where different traces represent different temperatures across a 3 K temperature range.

FIGS. 6A and 6B show modeled and measured polariton frequency, respectively, as a function of temperature. FIG. 6A shows numerical modelling of the polariton resonance frequency at different NV-cavity detunings (black dots in FIG. 5A), for temperatures spanning a 3 K range (different curves). FIG. 6B shows experimental polariton resonance frequencies as a function of NV-cavity detuning, taken across a temperature range of 11° C. to 14° C. (different curves).

Figure 7A:
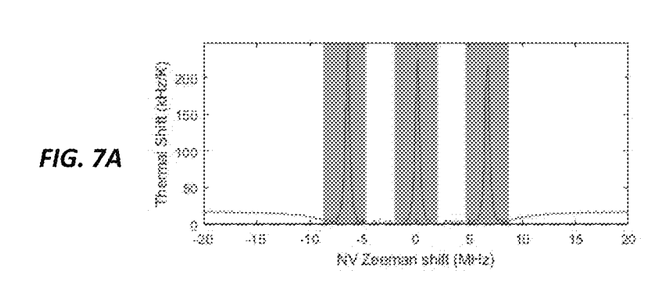
FIG. 7A is a plot of the numerically modeled average change in polariton frequency versus NV Zeeman shift across a 3 K temperature range.
Figure 7B:
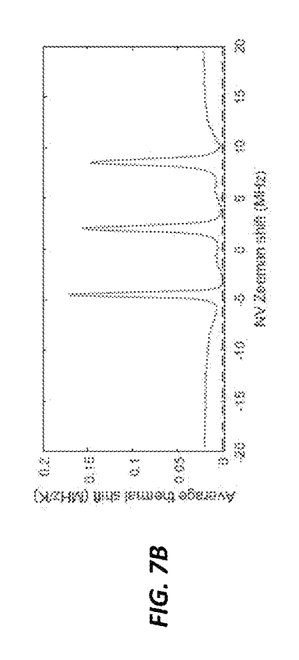
FIG. 7B is a plot of the experimentally measured average change in polariton frequency versus NV Zeeman shift across a 3 K temperature range.

FIGS. 7A and 7B show modeled and measured polariton thermal shifts, respectively. FIG. 7A shows the average change in modelled polariton frequency per unit temperature across a 3° C. temperature range as a function of NV-cavity detuning. The thermal response changes sign approaching the NV resonance (shaded box), resulting in points of zero average thermal shift. FIG. 7B shows the experimentally measured polariton thermal response. The shift is zero at an NV-cavity detuning of approximately 3 MHz.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein.

The foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of" "only one of" or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A clock comprising:
a solid-state host containing an ensemble of spin defect centers having a first resonance that decreases in frequency with increasing temperature and that increases in frequency with decreasing temperature;
a microwave resonator containing the solid-state host and having a cavity mode with a second resonance that increases in frequency with increasing temperature and that decreases in frequency with decreasing temperature; and
a microwave signal generator, in electromagnetic communication with the spin defect centers and the microwave resonator, to probe a polariton resonance formed by hybridization of the spin defect centers with the cavity mode with a microwave probe beam, the polariton resonance having a center frequency that is stable with temperature; and
a detector, in electromagnetic communication with the microwave resonator and the spin defect centers, to detect at least one of reflection or transmission of the microwave probe beam as a clock signal having a frequency stabilized with respect to changes in temperature by the polariton resonance.

2. The clock of claim 1, wherein the clock has a fractional frequency deviation of $10^{-13}$ over a measurement time of at least $10^3$ seconds.

3. The clock of claim 1, wherein a change in the center frequency of the polariton resonance with respect to temperature varies based on a detuning of the second resonance with respect to the first resonance.

4. The clock of claim 1, wherein the second resonance is detuned with respect to the first resonance based on a change in the center frequency of the polariton resonance with respect to temperature.

5. The clock of claim 1, wherein the solid-state host comprises diamond and the spin defect centers comprise nitrogen vacancy centers.

6. The clock of claim 1, wherein the detector is a homodyne detector configured to detect in-phase and quadrature components of a homodyne signal.

7. The clock of claim 1, further comprising:
an optical excitation source, in optical communication with the spin defect centers, to polarize the spin defect centers.

8. The clock of claim 1, further comprising:
a magnetic field source, in electromagnetic communication with the spin defect centers, to detune the second resonance with respect to the first resonance.

9. The clock of claim 1, further comprising:
circuitry, operably coupled to the microwave signal generator and the detector, to lock a frequency of the microwave probe beam to a frequency of the second resonance.

10. A method of stabilizing a clock comprising a solid-state host doped with an ensemble of spin defect centers having a first resonance that decreases in frequency with increasing temperature and that increases in frequency with decreasing temperature disposed in a microwave resonator having a cavity mode with a second resonance that increases in frequency with increasing temperature and that decreases in frequency with decreasing temperature, the method comprising:
probing a polariton resonance formed by hybridization of the spin defect centers with the cavity mode with a microwave probe beam, the polariton resonance having a center frequency that is stable with temperature; and
detecting at least one of reflection or transmission of the microwave probe beam as a clock signal having a frequency stabilized with respect to changes in temperature by the polariton resonance.

11. The method of claim 10, wherein the clock has a fractional frequency deviation of $10^{-13}$ over a measurement time of at least $10^3$ seconds.

12. The method of claim 10, wherein a change in the center frequency of the polariton resonance with respect to temperature varies based on a detuning of the second resonance with respect to the first resonance.

13. The method of claim 10, further comprising:
detuning the second resonance with respect to the first resonance based on a change in the center frequency of the polariton resonance with respect to temperature.

14. The method of claim 13, wherein detuning the second resonance with respect to the first resonance comprises:
applying a magnetic field to the spin defect centers.

15. The method of claim 10, wherein the solid-state host comprises diamond and the spin defect centers comprise nitrogen vacancy centers.

16. The method of claim 10, wherein detecting the at least one of reflection or transmission of the microwave probe beam comprises detecting in-phase and quadrature components of a homodyne signal.

17. The method of claim 10, further comprising:
polarizing the spin defect centers with a laser beam.

18. The method of claim 10, further comprising:
locking a frequency of the microwave probe beam to a frequency of the second resonance.

19. A method of stabilizing a clock comprising a solid-state host doped with an ensemble of spin defect centers disposed in a microwave resonator having a cavity mode, the method comprising:
probing a polariton resonance formed by hybridization of the spin defect centers with the cavity mode with a microwave probe beam, the polariton resonance having a frequency derivative with respect to temperature $dv_\pm/dT$ that approaches zero at a detuning between the spin defect centers and the cavity mode of $D_\pm = \pm\sqrt{2}g[\sqrt{|R|} - (1/\sqrt{|R|})]$, where g is a coupling rate between the spin defect centers and the cavity mode and $|R|$ is a magnitude of a ratio of temperature coefficients of the spin defect centers and the cavity mode; and
detecting at least one of reflection or transmission of the microwave probe beam as a clock signal having a frequency stabilized with respect to changes in temperature by the polariton resonance.

20. The method of claim 19, wherein the frequency derivative with respect to temperature $dv_+dT$ at the detuning $D_+$ is proportional to $|R|^{3/2}/[g(|R|+1)^2]$.

* * * * *